United States Patent [19]

Obata

[11] Patent Number: 5,079,449
[45] Date of Patent: Jan. 7, 1992

[54] SENSE AMPLIFIER CIRCUIT HAVING A POWER SUPPLY SWITCHING CIRCUIT

[75] Inventor: Takeo Obata, Osaka, Japan

[73] Assignee: Ricoh Company, Ltd., Tokyo, Japan

[21] Appl. No.: 556,842

[22] Filed: Jul. 23, 1990

[30] Foreign Application Priority Data

Jul. 28, 1989 [JP] Japan .................... 1-197501

[51] Int. Cl.$^5$ .......................... G06F 7/38; H03F 3/45
[52] U.S. Cl. .................... 307/465; 307/448; 307/468; 307/530
[58] Field of Search ............ 307/443, 448, 530, 465, 307/468, 202.1

[56] References Cited

U.S. PATENT DOCUMENTS

| | | | |
|---|---|---|---|
| 4,839,539 | 6/1989 | Takata | 307/465 |
| 4,857,775 | 8/1989 | Obata | 307/468 |
| 4,920,515 | 4/1990 | Obata | 365/189.08 |
| 4,959,564 | 9/1990 | Steele | 307/530 |
| 4,982,363 | 1/1991 | Sood | 307/530 |

Primary Examiner—Stanley D. Miller
Assistant Examiner—Margaret Rose Wambach
Attorney, Agent, or Firm—Cooper & Dunham

[57] ABSTRACT

A sense amplifier circuit has a sense amplifier disposed on a bit line of an AND array circuit; a switch for selecting an output of the sense amplifier; a power switch for the sense amplifier; and a device for turning the power switch on by using a turning-on signal with respect to the switch for selecting the output of the sense amplifier. When the output of the sense amplifier is selected by the switch, the power switch is turned on by using the turning-on signal of this switch so that the sense amplifier is operated. When a turning-off signal is transmitted from the switch of the sense amplifier and the output of the sense amplifier is not selected, the power switch is turned off by this turning-off signal.

3 Claims, 2 Drawing Sheets

SENSE AMPLIFIER CIRCUIT HAVING A POWER SUPPLY SWITCHING CIRCUIT

BACKGROUND OF THE INVENTION

1. Field of the Invention

The present invention relates to a sense apmlifier circuit used in an AND array circuit such as a programmable logic array, etc.

2. Description of the Related Art

A sense amplifier circuit is disposed on a bit line of an AND array of a programmable logic array, etc. This sense amplifier circuit is used when signals OE, CLK, etc. are selected through a switch turned on by the operation of a selecting circuit. In general, an electric current is supplied to the sense amplifier circuit from a power source at any time even when the above signals are not selected.

Accordingly, the sense amplifier circuit is operated at any time even when another switch is turned on and a signal from another integrated circuit is selected, thereby increasing the consumption of the electric current.

SUMMARY OF THE INVENTION

It is therefore an object of the present invention to provide a sense amplifier circuit in which the consumption of an electric current supplied to the sense amplifier circuit is reduced by automatically operating the sense amplifier circuit only when the sense amplifier circuit on a bit line of signals OE, CLK is selected.

The above object of the present invention can be achieved by a sense amplifier circuit comprising a sense amplifier disposed on a bit line of an AND array circuit; a switch for selecting an output of the sense amplifier; a power switch for the sense amplifier; and means for turning the power switch on by using a turning-on signal with respect to the switch for selecting the output of the sense amplifier.

When the output of the sense amplifier is selected by the switch, the power switch is turned on by using the turning-on signal of this switch so that the sense amplifier is operated. In contrast to this, when a turning-off signal is transmitted from the switch of the sense amplifier and the output of the sense amplifier is not selected, the power switch is turned off by this turning-off signal. Thus, no voltage is applied to the sense amplifier so that no electric current is consumed.

Thus, the consumption of the electric current supplied to the sense amplifier circuit can be reduced.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a sense amplifier circuit in the present invention will next be described in detail with reference to the accompanying drawings.

Figure 1:
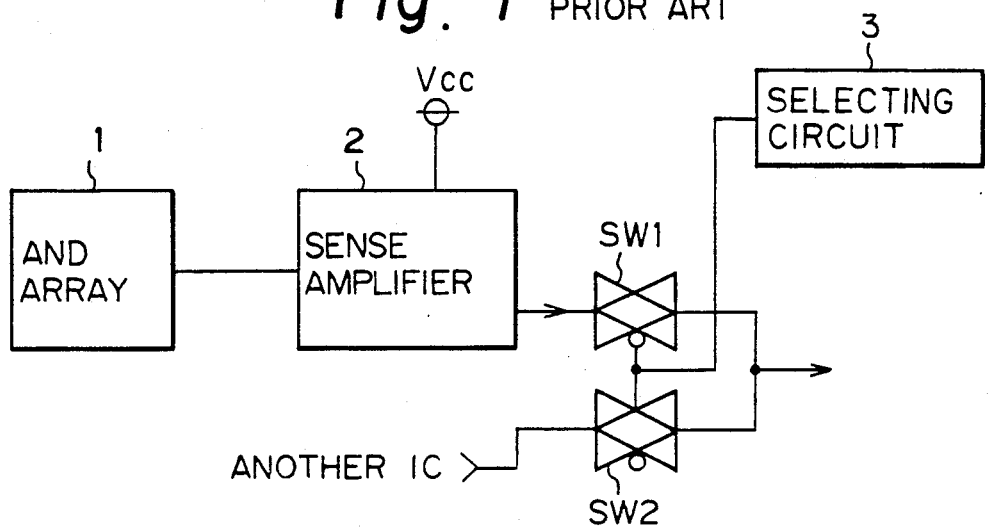
FIG. 1 is a view showing a programmable logic array circuit composed of a general sense amplifier circuit.

As shown in FIG. 1, a sense amplifier circuit 2 is disposed on a bit line of an AND array 1 of a programmable logic array, etc. This sense amplifier circuit 2 is used when signals OE, CLK, etc. are selected through a switch SW1 turned on by the operation of a selecting circuit 3. In general, similar to another sense amplifier constituting normal logic on a bit line, an electric current is always supplied to the sense amplifier circuit 2 from a power source Vcc, even when the above signals are not selected.

Accordingly, the sense amplifier circuit 2 is operated even when a switch SW2 is turned on and a signal from another integrated circuit (IC) is selected, thereby increasing the consumption of the electric current.

Figure 2:
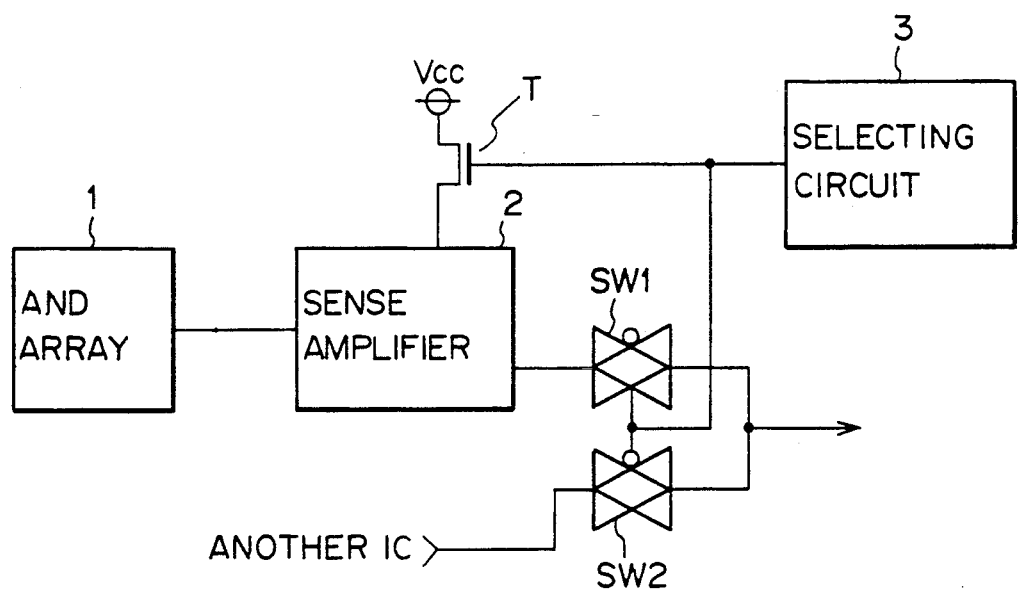
FIG. 2 is a control block diagram showing a programmable logic array circuit to which a sense amplifier circuit in an embodiment of the present invention is applied.

FIG. 2 shows a programmable logic array circuit to which a sense amplifier circuit in one embodiment of the present invention is applied. A sense amplifier 2 is connected to a power source Vcc through a transistor T. A control signal apppplied to switches SW1 and SW2 from a selecting circuit 3 is inputted to a gate of the transistor T.

In the above structure, when the voltage level of the control signal from the selecting circuit 3 is set to be high, the transistor T is turned on and the sense amplifier 2 is operated. An output signal from this sense amplifier 2 is transmitted to the switch SW1 which is turned on and to a subsequent circuit (not shown). In contrast to this, when the voltage level of the control signal from the selecting circuit 3 is set to be low, the switch SW2 is turned on and a signal from another integrated circuit is transmitted to the subsequent circuit (not shown). No electric current is supplied to the sense amplifier 2 since the transistor T is turned off.

Figure 3:
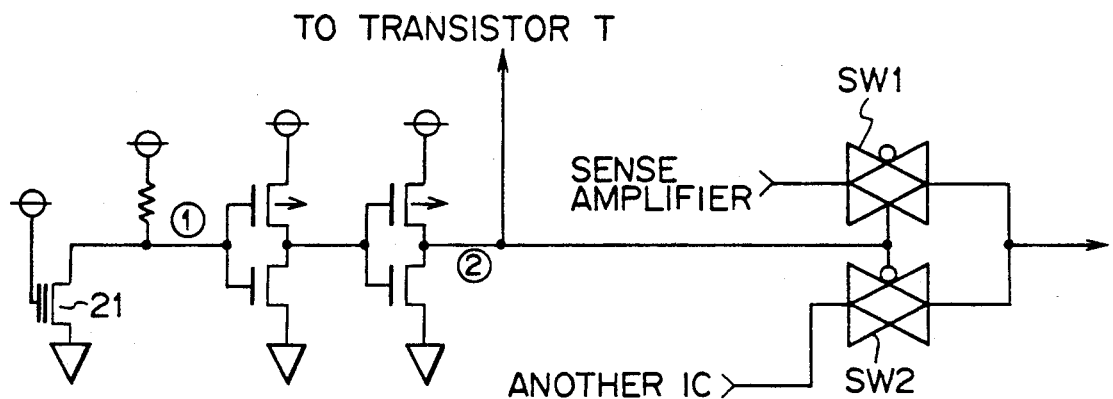
FIG. 3 is a circuit diagram showing one example of a selecting circuit in FIG. 2.

FIG. 3 shows an example of the above selecting circuit 3. Reference numeral 21 designates a cell PROM or EPROM. This cell 21 is turned on when this cell 21 is not programmed. In this case, the potential at point ① is logically low and the potential at point ② is low so that the switch SW2 is turned on. In contrast to this, the cell 21 is turned off when the cell 21 is programmed. In this case, the potential at poing ① is logically high and the potential at point ② is high so that the switch SW1 is turned on.

Figure 4:
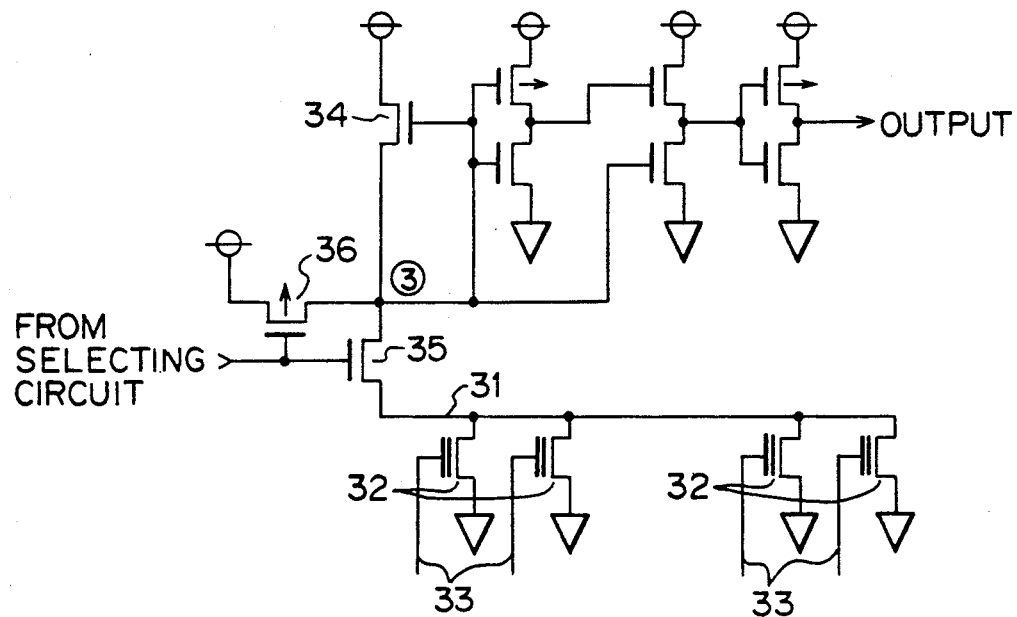
FIG. 4 is a circuit diagram showing one example of a sense amplifier in FIG. 2.

FIG. 4 shows a constructional example of the above sense amplifier 2. A bit line 31 is connected to ground GND through cells 32 composed of a plurality of PROMs or EPROMs. A word line 33 is connected to a gate of each of the cells 32.

In the normal operation of the sense amplifier 2, an electric current is supplied onto the bit line 31 through transistors 34 and 35. When all the cells 32 are turned off, the potential at point ③ is logically high so that the voltage level of an output signal of the sense amplifier is high. In contrast to this, when any one of the respective cells 32 is turned on, the electric current is supplied to the ground GND so that the electric current is consumed. In this case, the potential at point ③ is logically low and the voltage level of the output signal of the sense amplifier is low. A feedback operation is performed through a gate of the transistor 34 for supplying power to reduce oscillations in of the potential at point ③ and perform a sensing operation at a high speed.

In FIG. 4, transistors 35 and 36 correspond to the transistor T in FIG. 2. When the output of the sense amplifier 2 is selected, the voltage level of the control signal from the selecting circuit 3 is high so that the transistor 36 is turned off and the transistor 35 is turned on. Thus, the normal sensing operation mentioned above is performed. When no output of this sense amplifier 2 is used, the voltage level of the above control signal is low so that the transistor 36 is turned on and the transistor 35 is turned off. The potential at point ③ is compulsorily set to be high by the electric current supplied from the transistor 36. The transistor 34 is turned off and the voltage level of the output signal of the sense amplifier is fixedly set to be high. It is possible to set the consumption of the electric current to be zero since no electric current flows through the bit line 31.

The above-mentioned contents are summarized in the following Table 1.

TABLE 1

| use or nonuse of output | control signal | 36 | 35 | output | consumption of electric current |
| --- | --- | --- | --- | --- | --- |
| use | H | OFF | ON | changed by bit line | consumed |
| nonuse | L | ON | OFF | fixed to H | unconsumed |

As mentioned above, in accordance with the sense amplifier circuit of the present invention, when the sense amplifier circuit is not used, it is possible to automatically reduce the power of the sense amplifier circuit on the bit line used for signals OE, CLK, etc. in an AND array such as PAL, a programmable logic array. Thus, the consumption of the electric current flowing through an integrated circuit can be reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A sense amplifier circuit comprising:

a sense amplifier connected to a bit line of an AND array circuit and coupled to a power source through a power switch;

a switching means respectively connected to the sense amplifier and an electric circuit; and a selecting circuit respectively connected to the power switch and the switching means for selectively supplying a first control signal and a second control signal to the power switch and the switching means respectively;

the power switch being adapted to supply an electric power to the sense amplifier when receiving the first control signal from the selecting circuit and to prevent the supply of the electric power to the sense amplifier when receiving the second control signal from the selecting circuit;

the switching means being adapted to output one signal supplied from the sense amplifier when receiving the first control signal from the selecting circuit and to output another signal supplied from the electric circuit when receiving the second control signal from the selecting circuit.

2. An AND array circuit comprising:

bit lines and a sense amplifier coupled to at least one of said bit lines and having an output for a data signal and an operating power receiving input;

a selecting circuit having an output selectively providing an enabling signal;

a switch having an output, a first input coupled to the sense amplifier output and a second input coupled to said selecting circuit output and responsive to the receipt of said enabling signal to provide at its output the data signal received at its first input; and means coupling said selecting circuit to said operating power receiving input of said sense amplifier to cause said sense amplifier to draw power in accordance with the state of said enabling signal.

3. An AND array circuit as in claim 2 in which said means coupling the selecting circuit to the sense amplifier comprises means for powering said sense amplifier only while said enabling signal is causing said switch to provide said data signal at its output.

* * * * *